(12) United States Patent
Cheng et al.

(10) Patent No.: US 12,741,299 B2
(45) Date of Patent: Sep. 22, 2026

(54) APPARATUS AND METHODS FOR EXHAUST CLEANING

(71) Applicant: Taiwan Semiconductor Manufacturing Co., Ltd., Hsinchu (TW)

(72) Inventors: Wei Chang Cheng, Hsinchu (TW); Cheng-Kuang Chen, Hsinchu (TW); Chi-Hung Liao, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 35 days.

(21) Appl. No.: 18/627,313

(22) Filed: Apr. 4, 2024

(65) Prior Publication Data

US 2024/0246124 A1 Jul. 25, 2024

Related U.S. Application Data

(60) Division of application No. 17/212,925, filed on Mar. 25, 2021, now Pat. No. 11,980,920, which is a (Continued)

(51) Int. Cl.
*B08B 13/00* (2006.01)
*B08B 9/04* (2006.01)
(Continued)

(52) U.S. Cl.
CPC ............ *B08B 9/04* (2013.01); *C23C 16/4407* (2013.01); *H10P 72/0402* (2026.01); *H10P 72/0414* (2026.01); *H10P 72/0448* (2026.01)

(58) Field of Classification Search
None
See application file for complete search history.

(56) References Cited

U.S. PATENT DOCUMENTS

| | | |
|---|---|---|
| 2,595,602 A | 5/1952 | Parks |
| 5,256,848 A | 10/1993 | Cartry et al. |

(Continued)

FOREIGN PATENT DOCUMENTS

| | | |
|---|---|---|
| CN | 1279113 A | 1/2001 |
| CN | 106853451 A | 6/2017 |
| WO | WO 9623605 A1 | 8/1996 |

OTHER PUBLICATIONS

Google Patents translation of CN106853451A (Year: 2026).*

*Primary Examiner* — Eric W Golightly
(74) *Attorney, Agent, or Firm* — Seed IP Law Group

(57) ABSTRACT

Embodiments of the present disclosure relate to an apparatus for cleaning an exhaust path of a semiconductor process tool. One embodiment includes an exhaust pipe section and a residue remover including an inner opening through which exhaust gas may pass, and the residue remover is disposed in the exhaust pipe section and is operable to move. A gas-liquid separator is connected to the residue remover downstream from the residue remover and upstream from a factory exhaust. The gas-liquid separator includes a first pipe section including a first port passing through a side of the first pipe section for exhausting gas. A first deflector above the first port and extending from the side of the first pipe section above the first port, and a second deflector below the first deflector, entirely below the first port, and extending from the side of the first pipe section below the first port.

20 Claims, 8 Drawing Sheets

Related U.S. Application Data continuation of application No. 16/803,452, filed on Feb. 27, 2020, now Pat. No. 10,987,706, which is a division of application No. 15/610,082, filed on May 31, 2017, now Pat. No. 10,618,085.

(51) Int. Cl.
*C23C 16/44* (2006.01)
*H10P 72/00* (2026.01)

(56) References Cited

U.S. PATENT DOCUMENTS

| | | | |
|---|---|---|---|
| 6,604,257 | B1 | 8/2003 | Lee et al. |
| 2004/0053147 | A1 | 3/2004 | Ito |
| 2005/0048208 | A1 | 3/2005 | Kao et al. |
| 2007/0175500 | A1 | 8/2007 | Hohenwarter |
| 2007/0193573 | A1 | 8/2007 | Kim et al. |
| 2008/0047578 | A1 | 2/2008 | Yoo et al. |
| 2011/0088184 | A1 | 4/2011 | Mayer |
| 2011/0155384 | A1 | 6/2011 | Wright et al. |
| 2013/0097790 | A1 | 4/2013 | Liao |
| 2014/0332034 | A1 | 11/2014 | Lauerhaas et al. |
| 2014/0352726 | A1 | 12/2014 | Itoh et al. |
| 2015/0107623 | A1 | 4/2015 | Chien et al. |
| 2015/0294862 | A1 | 10/2015 | Wang |
| 2017/0232365 | A1 | 8/2017 | Phillips et al. |

* cited by examiner

APPARATUS AND METHODS FOR EXHAUST CLEANING

PRIORITY CLAIM

This application is a divisional of U.S. patent application Ser. No. 17/212,925 (U.S. Pat. No. 11,980,920) filed on Mar. 25, 2021, which is a continuation of U.S. patent application Ser. No. 16/803,452 (U.S. Pat. No. 10,987,706) filed on Feb. 27, 2020, which is a divisional of U.S. patent application Ser. No. 15/610,082 (U.S. Pat. No. 10,618,085), all of which are incorporated by reference in their entirety herein.

BACKGROUND

Semiconductor integrated circuits (ICs) are fabricated by a variety of processes for patterning, deposition, removal, and modification. The processes are performed in various semiconductor process tools. A typical semiconductor process tool includes a chamber where one or more substrates are treated by processing materials. The chamber is usually connected to exhaust pipes to remove excess processing materials and by-products of the processes from the chamber. With time, the exhaust pipes can become clogged by the excess processing materials and by-products. For example, excess photoresist from a photoresist coater crystalizes and clogs the exhaust pipe of the photoresist coater. As a result of a clogged exhaust pipe, thickness of a photoresist layer on a substrate processed by the photoresist coater becomes unstable and negatively affects process quality. Additionally, excess processing materials and by-products clogged in the exhaust pipe may cause corrosion of the exhaust pipe.

Accordingly, there is a need to solve the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
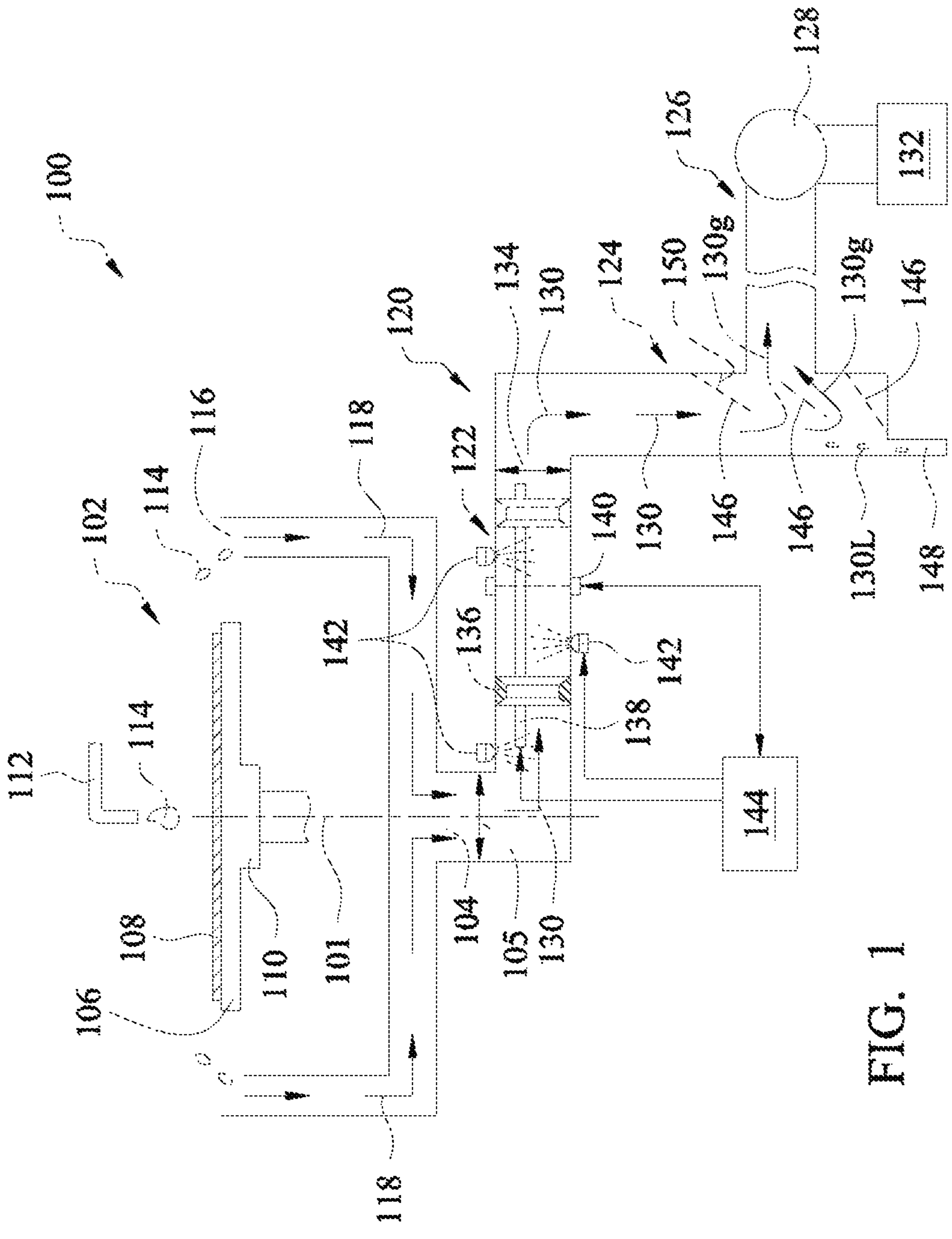
FIG. 1 is a schematic sectional view of a semiconductor process tool having an exhaust assembly in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic sectional view of a semiconductor process tool 100 in accordance with some embodiments. The semiconductor process tool 100 includes a process chamber 102 and an exhaust assembly 120. The exhaust assembly 120 connects the process chamber 102 to a factory exhaust 126. The exhaust assembly 120 provides an exhaust path to remove materials, such as excess process materials and by-products, from the process chamber 102. The exhaust assembly 120 is capable of automatic cleaning to maintain capacity of the exhaust path.

The process chamber 102 may be any suitable semiconductor process chamber. In FIG. 1, the process chamber 102 is a spin-coating chamber designed to coat a layer of photoresist on a substrate 108. The process chamber 102 includes a substrate stage 106 designed to retain the substrate 108 during processing. The substrate stage 106 includes a mechanism, such as a vacuum suction mechanism or other suitable mechanism, to secure the substrate 108 during operation.

The substrate stage 106 is operable to spin about a central axis 101 such that the substrate 108 secured thereon is spun during operation. A motion mechanism 110 is connected to the substrate stage 106 and operable to drive the substrate stage 106 and the substrate 108 secured thereon. In some embodiments, the motion mechanism 110 includes a motor to spin the substrate stage 106 and the substrate 108 secured thereon. In some embodiments, the motion mechanism 110 includes an elevation module to move the substrate stage 106 a vertical direction to position the substrate 108 at a lower or higher level.

The process chamber 102 includes a dispensing nozzle 112 for dispensing a photoresist 114 onto the substrate 108 secured on the substrate stage 106. During operation, the dispensing nozzle 112 dispenses the photoresist 114 on a spinning substrate 108 to coat the substrate 108 with a layer of the photoresist 114.

The process chamber 102 further includes a collecting mechanism 116 to collect materials spun off the substrate 108, such as excess photoresist 114. In some embodiments, the collecting mechanism 116 includes a cup to retain materials projected from the substrate stage 106. The collecting mechanism 116 directs the collected material, such as photoresist 114, along a path 118 towards an exhaust port 104 of the process chamber 102.

The exhaust assembly 120 is connected to the exhaust port 104 to remove materials, such as excess photoresist and by-products from the process chamber 102. The exhaust assembly 120 includes one or more pipe sections connecting a tool exhaust, such as the exhaust port 104, to the factory exhaust 126 where exhausts from semiconductor process tools in a fabrication laboratory are processed. In some embodiments, the factory exhaust 126 includes a vacuum pump 128 to generate an exhaust flow 130 through the exhaust assembly 120. The factory exhaust 126 includes a scrubber 132 to remove hazardous materials coming from the exhaust flow 130. In some embodiments, cross sectional areas 134 of pipe sections in the exhaust assembly 120 are at least as big as a cross sectional area 105 of the exhaust port 104 to maintain exhaust capacity of the exhaust port 104.

The exhaust assembly 120 includes a pipe cleaning assembly 122. The pipe cleaning assembly 122 automatically cleans the interior of the exhaust assembly 120 to maintain the cross-sectional area 134 open during operation. The pipe cleaning assembly 122 includes a residue remover 136 designed to remove materials accumulated in the exhaust assembly 120. An actuator 138 drives the residue remover 136 to perform a cleaning operation. Alternatively, the pipe cleaning assembly 122 can be manually activated to clean the exhaust assembly 120.

In some embodiments, the actuator 138 drives the residue remover 136 to perform a cleaning operation periodically. In some embodiments, the pipe cleaning assembly 122 performs the cleaning operation upon detection of accumulated materials in the exhaust assembly 120.

The pipe cleaning assembly 122 includes a sensor 140. The sensor 140 is connected to a controller 144. The sensor 140 is positioned to detect accumulated materials in the exhaust assembly 120. During operation, the controller 144 receives and analyzes measurements from the sensor 140. The controller 144 sends commands to the actuator 138 to drive the residue remover 136 to perform a cleaning operation when the measurements from the sensor 140 indicates that the accumulated materials has reached a certain degree, for example, when the accumulated materials block the sensor 140 or when the sensor 140 measurement reaches a threshold level. In some embodiments, measurements from the sensor 140 can be used to determine whether it is necessary to perform a manual cleaning or other periodical maintenance.

In some embodiments, the pipe cleaning assembly 122 includes a dispenser 142 designed to dispense a cleaning agent, such as a solvent of the accumulated materials in the exhaust assembly 120. In some embodiments, the dispenser 142 includes one or more spray nozzles. In some embodiments, the dispenser 142 periodically dispenses a cleaning agent to assist removal of accumulated materials. In some embodiments, the periodical dispenses of the dispenser 142 are synchronized with the periodic cleaning operation of the residue remover 136 to allow the residue remover 136 to benefit from the cleaning agent.

In some embodiments, the dispenser 142 is connected to the controller 144. The controller 144 operates the dispenser 142 when the cleaning agent is desired. For example, when the measurement of the sensor 140 reaches a pre-determined value, the controller 144 sends a spray command to the dispenser 142 to dispense the cleaning agent. The controller 144 can also control the amount of cleaning agent dispensed by the dispenser 142. In some embodiments, the dispenser 142 operates independently from the residue remover 136 and the sensor 140. For example, the dispenser 142 is configured to periodically dispense the cleaning agent while the residue remover 136 is operated in response to the measurements of the sensor 140. In some embodiments, the pipe cleaning assembly 122 includes one or more additional dispensers 142 positioned at different locations to cover different areas in the pipe.

Even though one pipe cleaning assembly 122 is shown in the embodiment of the FIG. 1, two or more pipe cleaning assemblies 122 may be used in an exhaust system according to process conditions, for example, when the exhaust path is long.

In some embodiments, the exhaust assembly 120 includes a gas-liquid separator 124 disposed downstream from the pipe cleaning assembly 122. The gas-liquid separator 124 is configured to separate gas and liquid in the exhaust flow 130 to prevent the liquid portion of the exhaust flow 130 from going to the factory exhaust 126. The gas-liquid separator 124 includes one or more deflectors 146. Each deflector 146 is positioned at an angle relative to the exhaust flow 130 to deflect the exhaust flow 130. In some embodiments, the deflector 146 is positioned at an angle 150 relative to an axial direction of the pipe section in the gas-liquid separator 124.

During operation, the gas-liquid separator 124 directs a liquid portion 1301 of the exhaust flow 130 towards a drain 148 while allowing a gas portion **130*g* of the exhaust flow 130 to flow towards the factory exhaust 126. The separation of liquid portion 1301 removes a majority of materials that are burdensome or harmful to the factory exhaust 126, thus, extending exhaust power and reducing maintenance frequencies of the factory exhaust 126**.

In some embodiments, the pipe cleaning assembly 122 is positioned in a substantially horizontal portion of an exhaust path which is susceptible to material accumulation. The gas-liquid separator 124 is positioned in a substantially vertical portion of the exhaust path so that gravity can be used to assist gas and liquid separation.

Figure 2A:
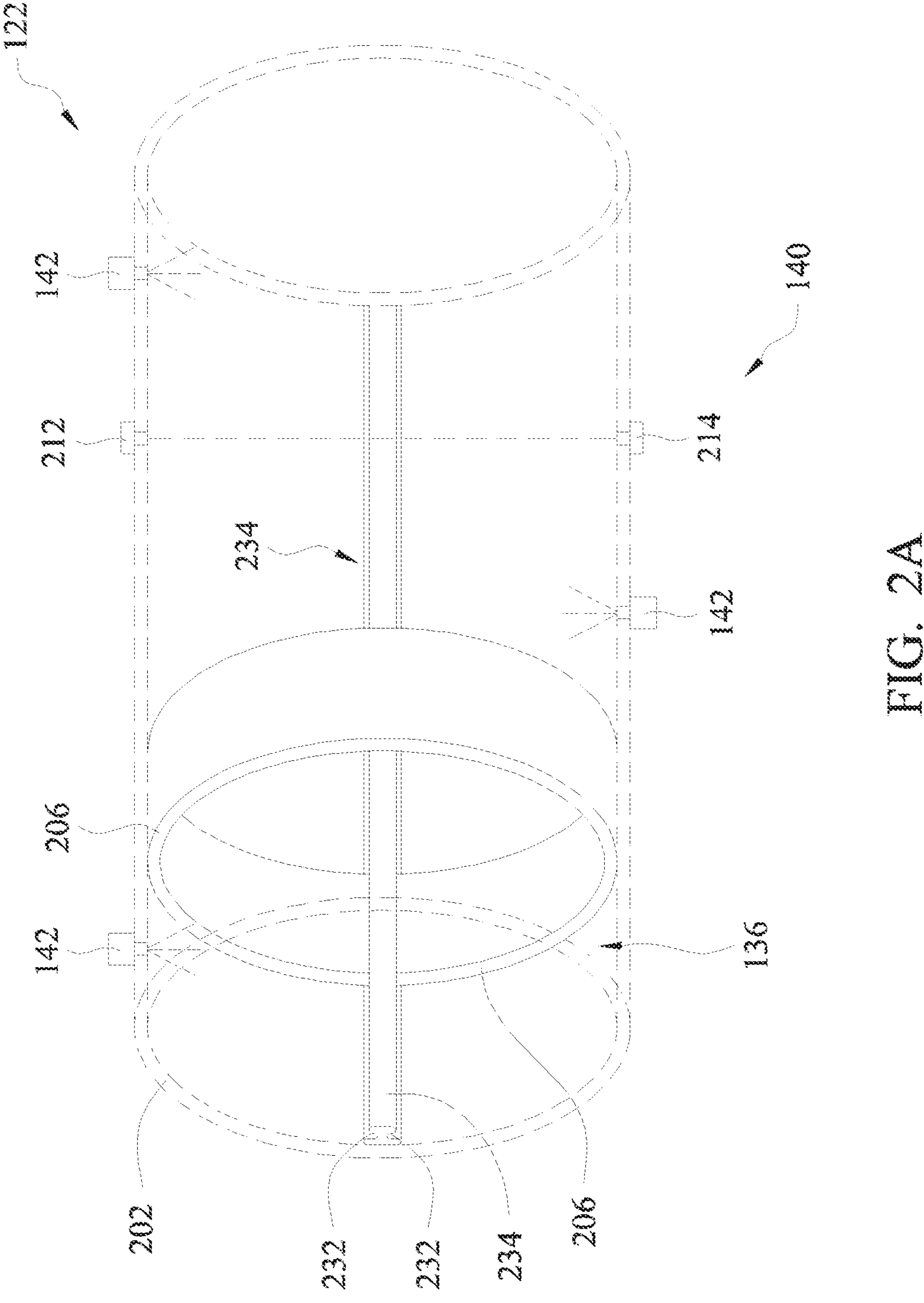
FIG. 2A is a schematic perspective view of the exhaust assembly showing a pipe cleaning assembly in accordance with some embodiments.
Figure 2B:
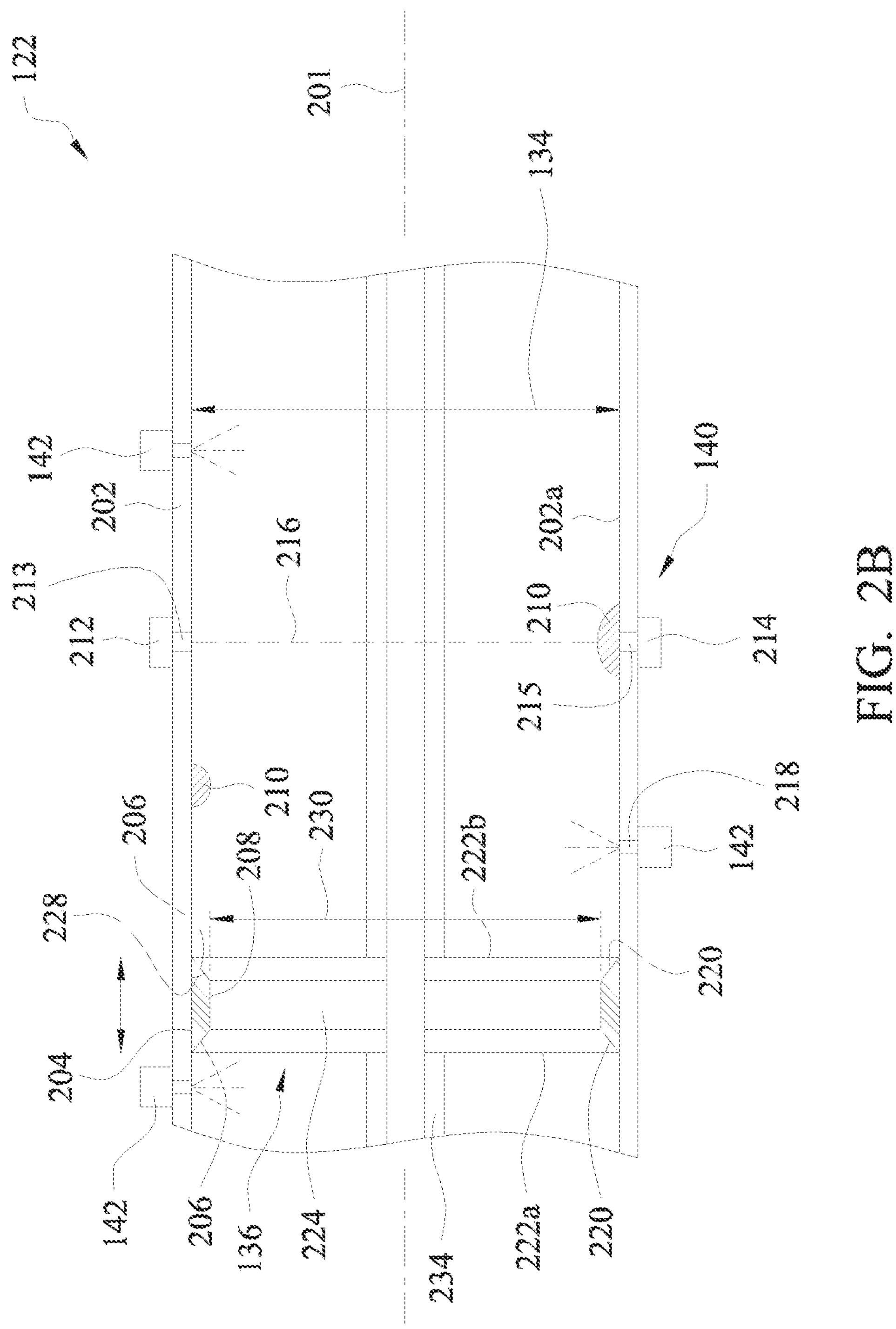
FIG. 2B is a schematic sectional view of the pipe cleaning assembly of FIG. 2A.

FIG. 2A is a schematic perspective view of the pipe cleaning assembly 122 in accordance with some embodiments. FIG. 2B is a schematic sectional view of the pipe cleaning assembly 122. The pipe cleaning assembly 122 is disposed in a pipe section 202 of the exhaust assembly 120. In some embodiments, the pipe section 202 is a cylindrical pipe and is a section of a linear pipe. The pipe section 202 is formed from materials compatible with the cleaning agent and the process materials exiting the process tools connected to the exhaust assembly 120. In some embodiments, the pipe section 202 is formed from stainless steel. The pipe section 202 can be formed from other suitable materials.

The residue remover 136 is disposed inside the pipe section 202. As shown, the residue remover 136 has a ring-shaped body 224 movably disposed in the pipe section 202. The residue remover 136 has an inner opening 208 to allow passages of the exhaust flow 130. A diameter 230 of the inner opening 208 may be greater than 80% of an inner diameter of the pipe section 202. In some embodiments, the diameter 230 may be between about 85% to about 95% of the inner diameter of the pipe section 202. An outer surface 204 of the ring-shaped body 224 is disposed against an inner surface **202*a* of the pipe section 202. The residue remover 136 is movable inside the pipe section 202 along an axial direction parallel to a central axis 201. When the residue remover 136 moves relative to the pipe section 202, the outer surface 204 of the ring-shaped body 224 scrapes the inner surface 202***a* of the pipe section 202 dislodging materials 210 stuck to the pipe section 202. The ring-shaped body 224 has a first end 222*a* and a second end 222*b*. In some embodiments, the ring-shaped body 224 has a sloped surface 220 at one or both ends 222*a*, 222*b*. The sloped surface 220 and the outer surface 204 form a wedge 206 in the cross section. The wedge 206 makes it easier to scrape materials from the inner surface 202*a*. The wedge 206 has an acute angle 228. In some embodiments, the angle 228 may be less than 45 degrees. For example, the angle 228 may be between about 10 degrees to about 30 degrees.

The residue remover 136 is formed from a metal or any suitable material compatible with materials in the exhaust flow 130. In some embodiments, the residue remover 136 is formed from a ferromagnetic material so that the residue remover 136 can be driven by a magnetic drive system. In some embodiments, the residue remover 136 is formed from a ferritic stainless steel, such as type 430Ti steel, type 434 steel, type 436 steel, or type 444 steel.

The actuator 138 of the magnetic drive system is a magnetic track 234 disposed along the pipe section 202. The residue remover 136 is coupled to the magnetic track 234 and movable back and forth along the magnetic track 234. In some embodiments, the magnetic track 234 is linear when the pipe section 202 is a linear pipe section. The magnetic track 234 may include one or more groove 232 along a longitudinal direction for receiving the residue remover 136 and guiding the residue remover 136 along the pipe section 202.

In some embodiments, the magnetic track 234 is curved when the pipe section 202 includes one or more curved portions. Alternatively, the actuator 138 can be other suitable drives, such as a motor drive, a hydraulic piston, or other actuators suitable for moving the residue remover 136 back and forth in the pipe section 202.

In some embodiments, the sensor 140 is an optical sensor assembly including a light source 212 and a light detector 214 positioned in the line of sight of the light source 212. The light source 212 and the light detector 214 can be attached to the pipe section 202 across from an inner volume of the pipe section 202. In some embodiments, the pipe section 202 includes optical windows 213 and 215 facing each other. The light source 212 is disposed outside the optical window 213 to dispatch lights through the optical window 213. The light detector 214 is disposed outside the optical window 215 to receive lights through the optical window 215.

In operation, the light source 212 shines a ray of light 216 through the optical window 213 across the inner volume of the pipe section 202. When there are no obstructions between the light source 212 and the light detector 214, the light detector 214 can detect the ray of light 216 indicating that the pipe section 202 is clean. When the light detector 214 fails to detect the ray of light 216 indicating that there are obstructions, such as materials 210, blocking the ray of light 216 from the light source 212 to the light detector 214. The duration of the ray of light 216 being blocked can be used to indicate the amount of materials 210 in the pipe section 202 or the degree of obstruction in the pipe section 202.

Figure 2C:
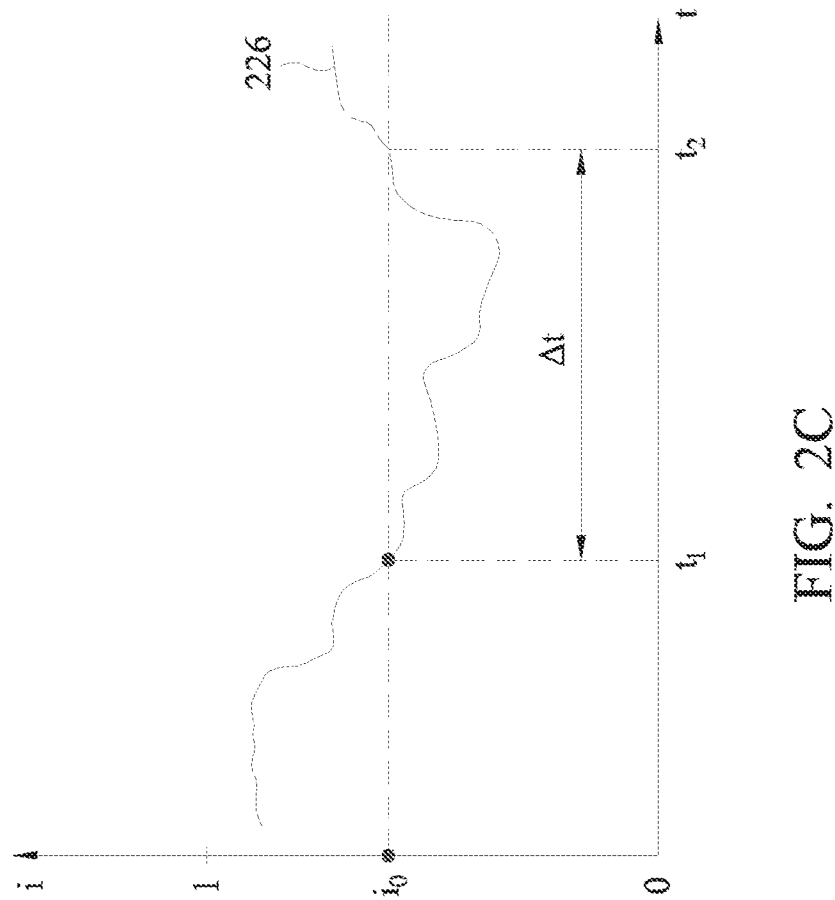
FIG. 2C is a schematic plot of sensor measurement in accordance to some embodiment.

FIG. 2C is a schematic plot of the output of the light detector 214. The x-axis of FIG. 2C denotes time and the y-axis of FIG. 2C denotes normalized intensity of light detected by the light detector 214. Curve 226 schematically illustrates measurement of the light detector 214 over time. The intensity of light detected by the light detector 214 corresponds to the amount of materials accumulated between the light source 212 and the light detector 214. A higher intensity corresponds to less accumulated material, thus, cleaner exhaust; while a lower intensity corresponds to more accumulated materials, thus, dirtier exhaust.

In some embodiments, a threshold intensity $i_0$ is used to indicate whether the light detector 214 or the light source 212 has been blocked by accumulated materials. When measurement of the light detector 214 is below $i_0$, the light detector 214 or the light source 212 is considered blocked, thus triggering a cleaning operation. In some embodiments, the threshold intensity $i_0$ may be below about 50%.

During operation, the light detector 214 or the light source 212 may be temporarily blocked by passing exhaust material or blocked by accumulated materials. In both instances, the measurement of the light detector 214 may fall below the threshold intensity $i_0$. A threshold time duration to may be used to differentiate between passing material and accumulated material and to trigger a cleaning operation. For example, when measurement of the light detector 214 is below the threshold intensity $i_0$ for longer than the threshold time period to, a cleaning operation is triggered. In one embodiment, the threshold time period to may be between about 5 seconds to 10 seconds.

Even though only one pair of light source 212 and light detector 214 are shown in the embodiment of FIG. 2, two or more pairs of light source 212 and light detector 214 can be disposed along the pipe section 202 at suitable locations. Alternatively, the sensor 140 can be other suitable sensors, such as a weight sensor, for example a compression force sensor. In some embodiments, the sensor 140 includes a combination of different types of sensors, such as an optical sensor and a weight sensor.

In some embodiments, the dispenser 142 is a spray nozzle positioned to spray a cleaning agent through a port 218 formed through the pipe section 202. Even though one dispenser 142 is shown in FIG. 2, two or more dispensers 142 can be used to satisfy process needs. For example, two or more dispensers 142 are positioned along a length of the pipe section 202. In other embodiment, two or more dispensers 142 are positioned at different radial positions about the central axis 201 to cover a perimeter of the inner surface 202*a*.

The cleaning agent sprayed by the dispenser 142 can be a suitable liquid cleaner for removing the exhaust material passing through the pipe section 202. In the situation when the exhaust material includes photoresist, the cleaning agent includes a solvent of the photoresist. For example, the cleaning agent is a solvent of the photoresist diluted with water. In some embodiments, the cleaning agent includes a solution of an organic solvent of the photoresist, for example NMP (N-methyl pyrrolidone), DMSO (dimethyl sulfoxide), acetone, or any suitable photoresist removers. In some embodiments, the dispenser 142 dispenses a solution of a photoresist solvent diluted in water at a weight ratio between about 1:10 to about 1:0.5. In one embodiment, the dispenser 142 dispenses a solution of NMP in water at a weight ratio of about 1:2.

Figure 3A:
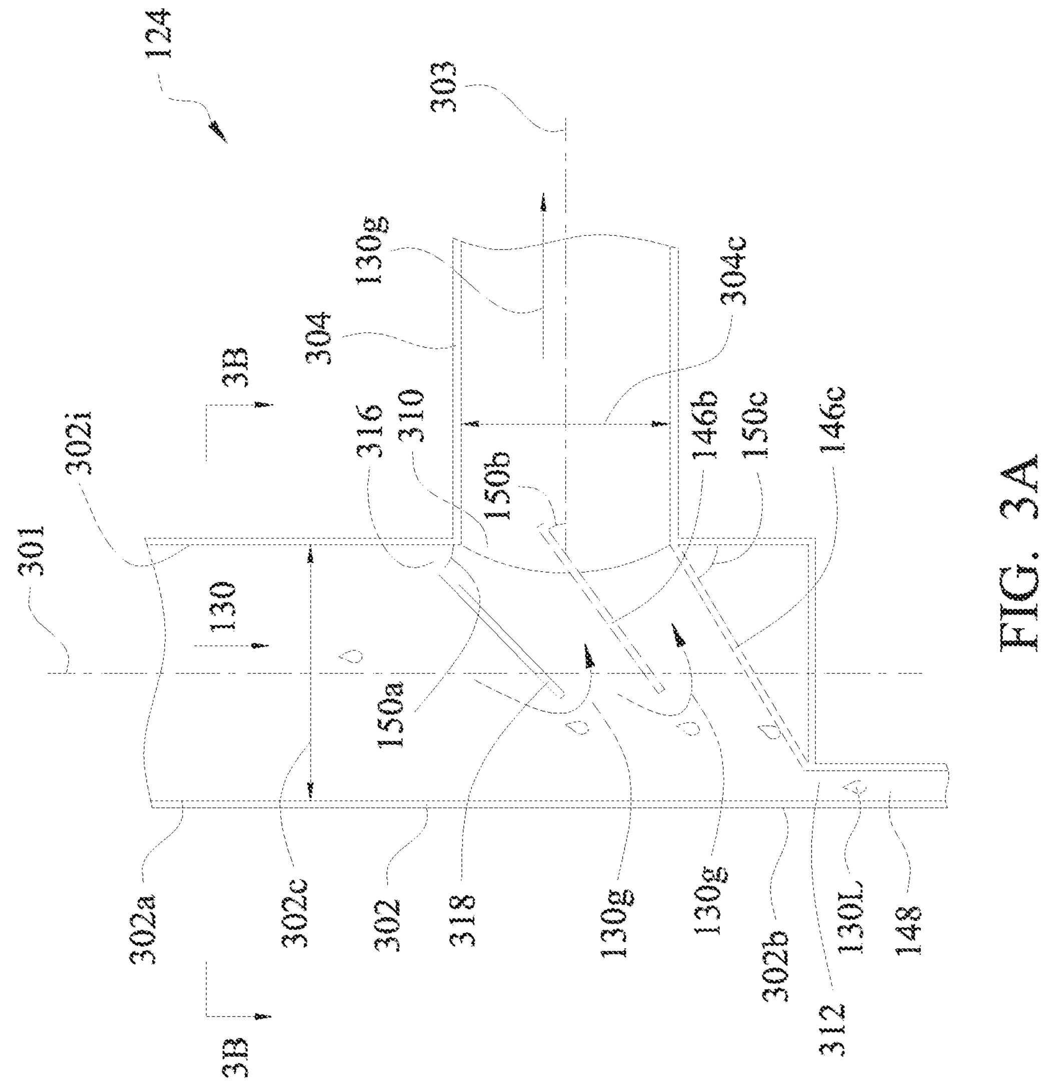
FIG. 3A is a schematic partial view of the exhaust assembly showing a gas-liquid separator in accordance with some embodiments.
Figure 3B:
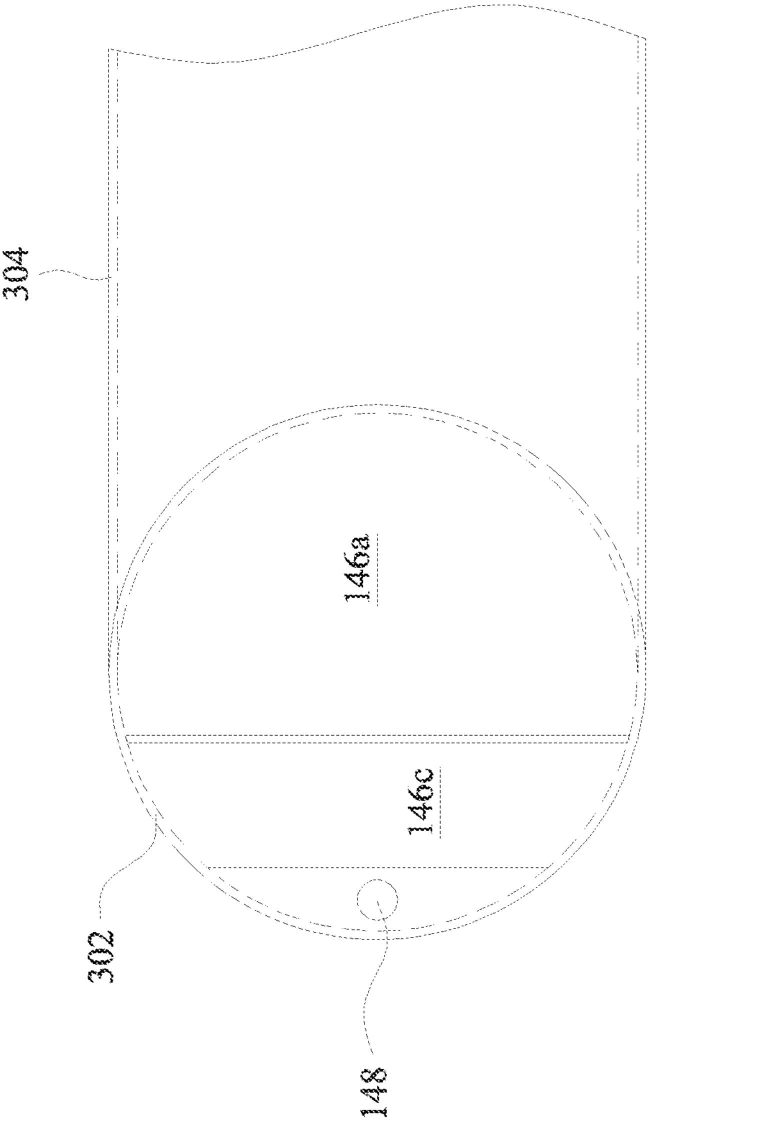
FIG. 3B is a schematic top view of the gas-liquid separator of FIG. 3A

FIG. 3A is a schematic partial view of the gas-liquid separator 124 in accordance with some embodiments. FIG. 3B is a schematic top view of the gas-liquid separator 124. The gas-liquid separator 124 includes a first pipe section 302 connected to a second pipe section 304. The second pipe section 304 is connected to the first pipe section 302 through a port 310. In some embodiments, a cross sectional area 302*c* of the first pipe section 302 and a cross sectional area 304*c* of the second pipe section 304 are similar in size. The first pipe section 302 has a central axis 301, and the second pipe section 304 has a central axis 303. The central axis 303 intersects the central axis 301. In some embodiments, the central axis 303 is perpendicular to the central axis 301. In some embodiments, the first pipe section 302 and the second pipe section 304 are formed unitarily, such as a T-pipe.

The first pipe section 302 includes a first end 302*a* for connecting to a tool, an exhaust pipe from a tool, or an exhaust pipe having a pipe cleaning assembly and a second end 302*b* for connecting to the drain 148. The second pipe section 304 is connected to the first pipe section 302 between the first end 302*a* and the second end 302*b*. In some embodiments, the first end 302*a* is connected downstream at a pipe cleaning assembly, such as the pipe cleaning assembly 122. Alternatively, the first end 302*a* can be connected to a common exhaust pipe from a tool, or directly connected to a tool, such as a process chamber. In some embodiments, the second end 302*a* of the first pipe section 302 is a closed end with a port 312 for communicating to a drain for collecting liquid, such as the drain 148.

The one or more deflectors 146 are positioned adjacent the port 310 and angled to prevent liquid from entering the port 310. In some embodiments, the port 312 is positioned below the port 310 so that the deflectors 146 direct liquid towards the port 312.

Each deflector 146 is a solid sheet having a first end 316 attached to an inner surface 302*i* of the first pipe section 302 and a second end 318 suspending in an inner volume of the first pipe section 302. The first end 316 is attached to the first pipe section 302 at the same side of the port 310. Each deflector 146 is sized to occupy a portion of the cross-sectional area 302*c* of the first pipe section 302 to allow fluid flow through the port 310. The deflector 146 may occupy more than 50% of the cross-sectional area 302*c*. In some embodiment, the deflector 146 may occupy between about 50% to about 85% of the cross-sectional area 302*c*. Each deflector 146 is attached to the first pipe section 302 at the angle 150 relative to an axial direction of the first pipe section 302. In operation, the exhaust flow 130 comes in the first pipe section 302 along the axial direction. The angle 150 is selected to deflect the exhaust flow 130, thus, directing the liquid portion 1301 in the exhaust flow 130 towards the port 312. In some embodiments, the angle 150 is less than 90 degrees, for example between about 30 degrees to about 60 degrees. In some embodiments, the one or more deflectors 146 are attached to the first pipe section 302 at the same angle. In other embodiments, the one or more deflectors 146 are attached to the first pipe section 302 at different angles to achieve a target effect.

In the embodiment of FIGS. 3A and 3B, the gas-liquid separator 124 includes three deflectors 146*a*, 146*b*, 146*c*. The first deflector 146*a* is disposed above the port 310 and at an angle 150*a* relative to the axial direction of the first pipe section 302. The second deflector 146*b* is attached to the first pipe section 302 near the port 310 and at an angle 150*b* relative to the axial direction of the first pipe section 302. The third deflector 146*c* is disposed below the port 310 and at an angle 150*c* relative to the axial direction of the first pipe section 302. In some embodiments, the angles 150*a*, 150*b*, 150*c* are the same. In other embodiments, the angles 150*a*, 150*b*, 150*c* are different angles.

The first deflector 146*a* is positioned to deflect the exhaust flow 130 such that the liquid portion 1301 of the exhaust flow 130 is deflected away from the port 310 and flows toward the port 312 under the gravity, while allowing the gas portion 130*g* of the exhaust flow 130 to flow around the deflector 146*a* and enter the port 310 under the suction of the vacuum pump 128. The liquid portion 1301 in the exhaust flow 130 may flow along the inner surface 302*i* of the first pipe section 302 due to negative pressure gradient or under gravity, especially when the first pipe section 302 is positioned substantially vertical. The first deflector 146*a* can prevent liquid from entering the port 310 along the inner surface 302*i*. Similarly, the second deflector 146*b* prevents the liquid portion 1301 in the exhaust flow 130 from entering the port 310.

The third deflector 146*c* is positioned to direct the liquid portion 1301 in the exhaust flow 130 towards the port 312. In some embodiments, the third deflector 146*c* is sloped down from below the port 310 to the port 312 and functions as a funnel to direct liquid near the second end 302*b* to the port 312.

Figure 4A:
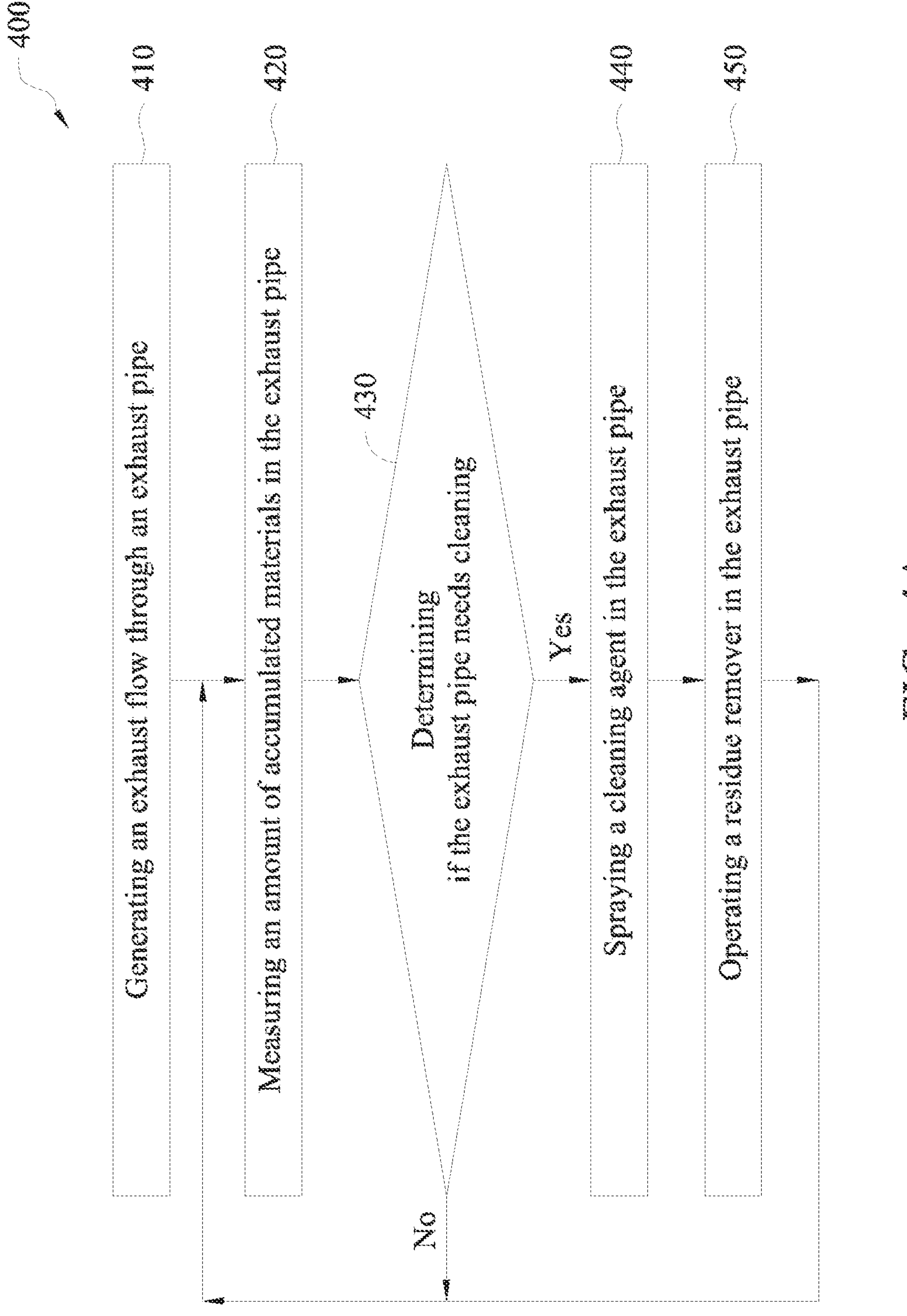
FIG. 4A is a flow chart of a method for cleaning an exhaust pipe in accordance with some embodiments.

FIG. 4A is a flow chart of a method 400 for cleaning an exhaust pipe in accordance with some embodiments. The method 400 can be performed by exhaust assemblies according to embodiments of the present disclosure, such as the exhaust assembly 120 described above. The method 400 can be carried out by operating a program in a controller, such as the controller 144 connected to the exhaust assembly 120.

In operation 410 of the method 400, materials, such as excess process materials and by-products, are removed from a semiconductor process tool, such as a spin coating tool, by generating an exhaust flow through an exhaust assembly connected to the semiconductor process tool. The exhaust assembly includes a pipe cleaning assembly, such as the pipe cleaning assembly 122. Removal of the materials can be performed using a vacuum pump, such as the vacuum pump 128, connected to the exhaust assembly to generate the exhaust flow. In some embodiments, removal of the materials via the exhaust flow according to operation 410 is performed continuously.

In some embodiments, the operation 410 further includes separating liquid and gas portions in the exhaust flow through the exhaust assembly using a gas-liquid separator, such as the gas-liquid separator 124.

In operation 420 of the method 400, the amount of accumulated materials, such as crystalized photoresist, in the exhaust assembly is measured. The measurement can be performed by one or more sensors disposed in the exhaust assembly, for example, by the sensor 140 of the pipe cleaning assembly 122. The accumulated materials can be measured using an optical sensor, wherein obstruction of a light detector in the optical sensor indicates that materials are accumulated in the exhaust pipe. In some embodiments, time duration of the obstruction of the light detector in the optical sensor indicates the amount of accumulated materials in the exhaust assembly. A longer time period of obstruction indicates a larger amount of accumulated materials.

In operation 430 of the method 400, the sensor measurement of accumulated materials is analyzed to determine whether the amount of accumulated materials in the exhaust assembly has reached a pre-determined level. In some embodiments, the amount of accumulated materials corresponds to the duration of the light detector of the optical sensor being obstructed, and the pre-determined level of accumulated materials corresponds to a pre-determined time period of the light detector being obstructed. The pre-determined time period may be between 5 to 10 seconds.

Measuring the accumulated materials in operation 420 and determining the amount of accumulated materials in operation 430 are performed periodically during performance of exhaust flow to remove materials according to operation 410.

When the amount of accumulated materials is lower than the pre-determined level, a new measurement can be taken and determined as material removal in operation 410 continues. When the amount of accumulated materials reaches the pre-determined level, the self-cleaning operation is triggered.

In operation 440 of the method 400, a cleaning agent is sprayed in the exhaust assembly 120. The cleaning agent is sprayed using a dispenser, such as the dispenser 142 in the exhaust assembly 120. The cleaning agent can be a solvent of the accumulated materials or other suitable agent. When the accumulated materials include crystalized photoresist, the cleaning agent can be a solution of an organic solvent of photoresist, such as NMP and DMSO, or other suitable agent.

In some embodiments, a fixed amount of cleaning agent can be sprayed in each operation. In other embodiments, the measured amount of accumulated materials is used to determine the amount of cleaning agent to be dispensed. When a larger amount of accumulated materials is detected, a larger amount of cleaning agent is dispensed. In some embodiments, the amount of cleaning agent dispensed is controlled by the duration of time the dispenser is activated. In some embodiments, the active time of the dispenser may be between about 10 seconds to about 20 seconds.

In some embodiments, spraying of the cleaning agent is followed by a soaking period before removing the accumulated materials using a residue remover in operation 450. In some embodiments, the soaking period may be between about 10 seconds to about 20 seconds.

In operation 450, a residue remover, such as the residue remover 136 in the exhaust assembly 120, is activated to remove the accumulated materials from the exhaust assembly 120. The residue remover moves on an inner surface of an exhaust pipe to dislodge the accumulated materials. In some embodiments, the residue remover moves back and forth along the exhaust pipe to dislodge the accumulated materials. In some embodiments, the residue remover is activated for a fixed amount of time in each operation. In other embodiments, the active time of the residue remover is determined by the measured amount of accumulated materials. When more accumulated materials are detected, a longer active time is selected. After each self-cleaning operation, a new measurement as in operation 430 can be taken and determined. In some embodiments, the active time may be between about 10 seconds to 60 seconds.

The method 400 provides a self-cleaning operation for cleaning an exhaust pipe for a semiconductor process tool. Operations in the method 400 can be performed in combination or independently as needed. In some embodiments, one or more operations in operation 420, operation 430, operation 440 and operation 450 can be omitted.

In some embodiments, an exhaust assembly can be cleaned by periodically operating a residue remover to dislodge accumulated materials in an exhaust pipe as in operation 450 while generating an exhaust flow through the exhaust pipe as in operation 410.

In some embodiments, an exhaust assembly can be cleaned by periodically operating a residue remover to dislodge accumulated materials in an exhaust pipe as in operation 450 and spraying a cleaning agent as in operation 440 while generating an exhaust flow through the exhaust pipe as in operation 410.

In some embodiments, an exhaust assembly can be cleaned by periodically spraying a cleaning agent as in operation 440 while generating an exhaust flow through the exhaust pipe as in operation 410.

In some embodiments, a self-cleaning operation is triggered when a measurement of accumulated materials reaches a pre-determined level as in operation 430. The self-cleaning operation can include spraying a cleaning agent in the exhaust pipe as in operation 440 and operating the residue remover as in operation 450. In some embodiments, the self-cleaning operation includes operating the residue remover as in operation 450 without spraying the cleaning agent. In some embodiments, the self-cleaning operation includes spraying a cleaning agent in the exhaust pipe as in operation 440 without operating the residue remover.

Figure 4B:
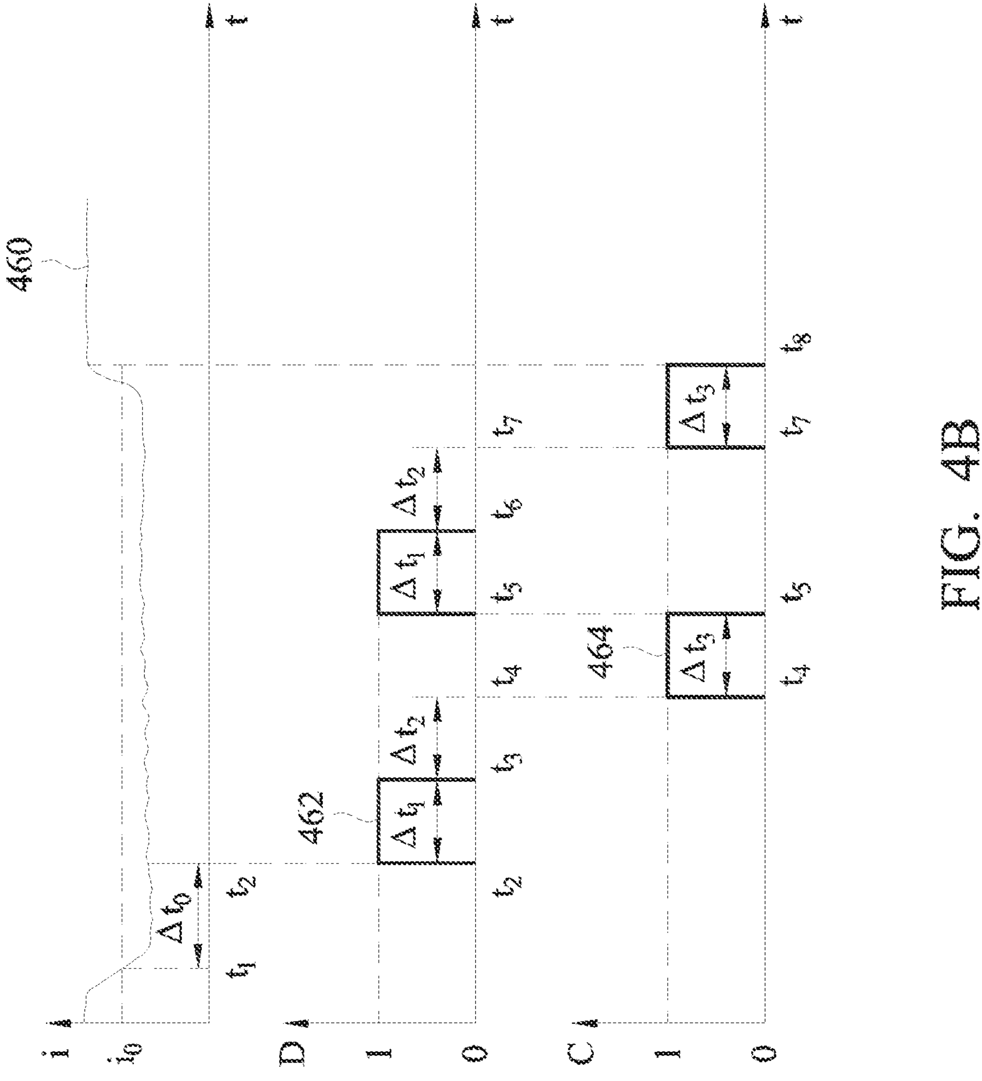
FIG. 4B is a schematic plot showing a cleaning process in accordance with some embodiments.

FIG. 4B is a schematic plot showing an exemplary cleaning process during a time period according to the method 400. Curve 460 denotes measurement of the sensor 140 over time. Curve 462 denotes status of the dispenser 142 over time. Value 1 in curve 462 indicates that the dispenser 142 is active while value 0 indicates that the dispenser 142 is inactive. Curve 464 denotes status of the residue remover 136 over time. Value 1 in curve 464 indicates that the residue remover 136 is active while value 0 indicates that the residue remover 136 is inactive.

When an exhaust flow is flowing through an exhaust pipe, the measurement of the sensor 142 is monitored during operations 410 and 420. When measurement of the sensor 140 is above the threshold value $i_0$, the dispenser 142 and the residue remover 136 are inactive. At time $t_1$, sufficient materials have accumulated to cause the measurement of the sensor 140 to drop below the threshold value $i_0$. At time $t_2$, the measurement of the sensor 140 has stayed below the threshold value $i_0$ for a threshold period of time $\Delta t_0$, which causes activation of the dispenser 142 as in operation 440. At time $t_3$, the dispenser 142 has been activated for a period of time $\Delta t_1$, the dispenser 142 is inactivated to allow the cleaning agent to soak. At time $t_4$, after a soaking period $\Delta t_2$ has passed, the residue remover 136 is activated to remove the accumulated materials as in operation 450. At time $t_5$, the residue remover 136 has been active for an active period $\Delta t_3$ and is inactivated. Upon inactivation of the residue remover 136, one cleaning cycle has been completed. Since at time $t_5$, measurement of the sensor 140 is still below the threshold value $i_0$, a subsequent cleaning cycle, including spraying, soaking, and residue removal, is performed from time $t_5$ to time $t_8$. At time $t_8$, measurement of the sensor 140 is above the threshold value $i_0$, which causes the dispenser 142 and the residue remover 136 to stay inactive until measurement of the sensor 140 drops below the threshold value $i_0$ for a threshold period of time $\Delta t_0$ again.

The residue remover automatically cleans the exhaust pipes, thus improving productivity by reducing or eliminating manual exhaust cleaning. Embodiments of the disclosure allow the exhaust assemblies to self-detect material accumulation to maintain a stable exhaust condition, thus, improving process quality and avoiding exhaust pipe corrosion. Using a cleaning agent from the dispenser improves effectiveness of the residue remover. The gas-liquid separator prevents harmful materials from entering the factory exhaust, thus lowering burden of the factory exhaust and decreasing running holds due to exhaust alarms. Embodiments of the present disclosure keep an exhaust path of a semiconductor tool open, thus improving productivity by eliminating or reducing manual cleanings, stabilizing exhaust pipes and reducing corrosion in the exhaust pipes, decreasing running holds caused by clogged exhaust pipes, prolonging duration between periodical maintenance, and reducing substrate rework rate.

The exhaust assemblies according to the present disclosure can be added to any tube or pipe systems for semiconductor process tools, for example, spinning coaters, photoresist developers, photolithography scanners, physical vapor deposition chambers, chemical vapor deposition chambers, electroplating chambers, etch chambers, chemical mechanical polishing chambers, epitaxial deposition chambers, rapid temperature process chambers, annealing chambers, and the likes.

Some embodiments provide a method for semiconductor processing. The method includes generating an exhaust flow through an exhaust pipe, monitoring accumulated material in the exhaust pipe, and activating a residue remover disposed in the exhaust pipe section to remove accumulated materials from the exhaust pipe.

Some embodiments provide an exhaust assembly for a semiconductor process tool. The exhaust assembly includes an exhaust pipe section, a sensor positioned to detect accumulated materials in the exhaust pipe section, a dispenser positioned to dispense a cleaning agent in the exhaust pipe section, and a residue remover disposed in the exhaust pipe section. The residue remover is operable to move in the exhaust pipe section to dislodge accumulated materials from an inner surface of the exhaust pipe section.

Some embodiments provide a method for semiconductor processing. The method includes generating an exhaust flow through an exhaust pipe section, dispensing a cleaning agent in the exhaust pipe section; and moving a residue remover of the pipe cleaning assembly in the exhaust pipe section to remove accumulated materials from the exhaust pipe section.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An exhaust assembly for a semiconductor process tool, the exhaust assembly comprising:

an exhaust pipe section;

a residue remover including an inner opening through which exhaust gas may pass through, wherein the residue remover disposed in the exhaust pipe section, and wherein the residue remover is operable to move in the exhaust pipe section;

a gas-liquid separator connected to the residue remover downstream from the residue remover and upstream from a factory exhaust, the gas-liquid separator including a first pipe section including a first port passing through a side of the first pipe section for exhausting gas from the first pipe section;

a first deflector above the first port and extending from the side of the first pipe section above the first port; and a second deflector below the first deflector, entirely below the first port, and extending from the side of the first pipe section below the first port.

2. The exhaust assembly of claim 1, wherein the residue remover comprises:

a ring-shaped body having an outer surface positioned against an inner surface of the exhaust pipe section.

3. The exhaust assembly of claim 2, wherein the ring-shaped body has a sloped surface, and the sloped surface and the outer surface of the ring-shaped body form a wedge.

4. The exhaust assembly of claim 1, wherein the gas-liquid separator further comprises a second pipe section connected to the first pipe section at the first port, and the first pipe section has a second port connected to a drain.

5. The exhaust assembly of claim 4, wherein the first deflector is positioned to direct a liquid portion in an exhaust gas entering the first pipe section to the second port.

6. The exhaust assembly of claim 1, wherein one or more of the first deflector and the second deflector occupy more than 50% of a cross-sectional area of the first pipe section.

7. The exhaust assembly of claim 1, wherein one or more of the first deflector and the second deflector is attached to the first pipe section at an angle between 30 degrees to 60 degrees relative to an axial direction of the first pipe section.

8. An exhaust assembly for a semiconductor process tool, exhaust assembly comprising:

an exhaust pipe section;

a residue remover including an inner opening through which exhaust gas may pass through, wherein the residue remover disposed is in the exhaust pipe section, and wherein the residue remover is operable to move in the exhaust pipe section;

a gas-liquid separator connected to the residue remover downstream from the residue remover and upstream from a factory exhaust, the gas-liquid separator including a first pipe section including a first port passing through a side of the first pipe section for exhausting gas from the first pipe section;

a first deflector above the first port and extending from the side of the first pipe section above the first port;

a second deflector below the first deflector and entirely below the first port and extending from the side of the first pipe section below the first port; and a magnetic drive system coupled to the residue remover and operable to move the residue remover in the exhaust pipe section.

9. The exhaust assembly of claim 8 wherein the magnetic drive system includes a curved magnetic track.

10. The exhaust assembly of claim 9, wherein the gas-liquid separator further comprises a second pipe section connected to the first pipe section at the first port, and the first pipe section has a second port connected to a drain.

11. The exhaust assembly of claim 10, wherein the first deflector is positioned to direct a liquid portion in an exhaust gas entering the first pipe section to the second port.

12. The exhaust assembly of claim 9, wherein one or more of the first deflector and the second deflector occupy more than 50% of a cross-sectional area of the first pipe section.

13. The exhaust assembly of claim 9, wherein one or more of the first deflector and the second deflector is attached to the first pipe section at an angle between 30 degrees to 60 degrees relative to an axial direction of the first pipe section.

14. An exhaust assembly for a semiconductor process tool, the exhaust assembly comprising:

an exhaust pipe section;

a residue remover including an inner opening through which exhaust gas may pass through, wherein the residue remover is disposed in the exhaust pipe section, and wherein the residue remover is operable to move in the exhaust pipe section;

a gas-liquid separator connected to the residue remover downstream from the residue remover and upstream from a factory exhaust, the gas-liquid separator including:

a first pipe section including a first port passing through a side of the first pipe section for exhausting gas from the first pipe section; and a second pipe section connected to the first piper section, the second pipe section is transverse to the first pipe section, wherein the second pipe section is configured to, in operation, allow liquid to pass through a second port at an end of the second pipe section;

a drain connected to the second pipe section of the gas-liquid separator, wherein the drain is downstream from the second pipe section of the gas-liquid separator, and wherein the drain is configured to, in operation, drain the liquid away from the gas-liquid separator;

a first deflector above the first port and extending inward from the side of the first pipe section above the first port; and a second deflector below the first deflector, entirely below the first port of the first pipe section and extending inward from the side of the first pipe section below the first port, and wherein the factory exhaust is connected to the second pipe section of the gas-liquid separator and is downstream the first pipe section portion of the gas-liquid separator, wherein the factory exhaust is configured to, in operation, exhaust the gas away from the gas-liquid separator pipe section.

15. The exhaust assembly of claim 14, further comprising a third deflector between the first deflector and the second deflector, and the third deflector is aligned with and overlaps the gas port of the gas portion of the gas-liquid separator pipe section.

16. The exhaust assembly of claim 14, wherein:

the first deflector is at a first angle relative to a central axis of the gas portion of the gas-liquid separator pipe section;

the second deflector is at a second angle relative to the central axis of the gas portion of the gas-liquid separator pipe section; and the third deflector is at a third angle relative to the central axis of the gas portion of the gas-liquid separator pipe section.

17. The exhaust assembly of claim 16, wherein the first angle, the second angle, and the third angle are equal to each other.

18. The exhaust assembly of claim 16, wherein at least two of the first angle, the second angle, and the third angle are different from each other.

19. The exhaust assembly of claim 16, wherein the first angle, the second angle, and the third angle are different from each other.

20. The exhaust assembly of claim 14, wherein the second deflector extends from the gas port of the gas portion of the gas-liquid separator pipe section to the drain.

* * * * *